United States Patent
Nagashima et al.

(10) Patent No.: US 9,490,713 B2
(45) Date of Patent: Nov. 8, 2016

(54) POWER SUPPLY

(71) Applicant: FDK CORPORATION, Tokyo (JP)

(72) Inventors: Eiji Nagashima, Tokyo (JP); Toshio Shibata, Tokyo (JP)

(73) Assignee: FDK CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 14/799,372

(22) Filed: Jul. 14, 2015

(65) Prior Publication Data

US 2016/0043646 A1 Feb. 11, 2016

(30) Foreign Application Priority Data

Jul. 15, 2014 (JP) .................. 2014-144919

(51) Int. Cl.
*H02M 3/335* (2006.01)
*G01R 19/00* (2006.01)

(52) U.S. Cl.
CPC .......... *H02M 3/33507* (2013.01); *G01R 19/00* (2013.01)

(58) Field of Classification Search
CPC ................................. H02M 3/33507
See application file for complete search history.

(56) References Cited

U.S. PATENT DOCUMENTS

| 5,724,237 A | * | 3/1998 | Hunter | .................. | H02M 3/285 323/272 |
| 2007/0285076 A1 | * | 12/2007 | Dequina | .................. | G05F 1/46 323/316 |

FOREIGN PATENT DOCUMENTS

JP 11-327663 11/1999
JP 2002-262553 A 9/2002

\* cited by examiner

*Primary Examiner* — Emily P Pham
(74) *Attorney, Agent, or Firm* — Marshall, Gerstein & Borun LLP

(57) ABSTRACT

A DC/DC converter 10 of the present invention is provided with a constant-voltage power supply circuit 11; a SENSE+ terminal; a SENSE−/OCPSEL terminal pulled up to a predetermined voltage VL through a pull-up resistor R8; and a controller 14 for controlling the constant-voltage power supply circuit 11, wherein the controller 14 controls the output voltage Vout of the constant-voltage power supply circuit 11 on the basis of a potential difference between the SENSE+ terminal and the SENSE−/OCPSEL terminal, on the condition that the voltage of the SENSE−/OCPSEL terminal is lower than a threshold voltage, and sets predetermined control parameters on the basis of the voltage of the SENSE−/OCPSEL terminal, on the condition that the voltage of the SENSE−/OCPSEL terminal is equal to or higher than the threshold voltage.

2 Claims, 5 Drawing Sheets

FIG. 4

| EXTERNAL RESISTOR | SENSE−/OCPSET A/D VALUE | | | OCP | DESIGNATED VALUE FAULT | DESIGNATED VALUE WARNING |
|---|---|---|---|---|---|---|
| | MIN VALUE | TYP VALUE | MAX VALUE | | | |
| short | 0 | | 164 | flag_sense_m=1 (SENSE−) | | |
| 10kΩ | 165(ext_ocp0_min) | 179 | 214(ext_ocp0_max) | 15% | ext_ocp0_F | ext_ocp0_W |
| 15kΩ | 215 | 252 | 293(ext_ocp1_max) | 30% | ext_ocp1_F | ext_ocp1_W |
| 24kΩ | 294 | 343 | 393(ext_ocp2_max) | 45% | ext_ocp2_F | ext_ocp2_W |
| 36kΩ | 394 | 447 | 498(ext_ocp3_max) | 60% | ext_ocp3_F | ext_ocp3_W |
| 56kΩ | 499 | 551 | 604(ext_ocp4_max) | 75% | ext_ocp4_F | ext_ocp4_W |
| 82kΩ | 605 | 657 | 704(ext_ocp5_max) | 90% | ext_ocp5_F | ext_ocp5_W |
| 130kΩ | 705 | 751 | 790(ext_ocp6_max) | 100% | ext_ocp6_F | ext_ocp6_W |
| open | 791 | | | flag_ext_ocp=0 (default) | | |

POWER SUPPLY

BACKGROUND OF THE INVENTION

1. Field of the Invention

The present invention relates to a power supply device having remote-sensing functions.

2. Description of the Related Art

There has been heretofore known a power supply device provided with a remote-sensing terminal to which the voltage of a loading apparatus is input and having remote-sensing functions for controlling the output voltage of the device on the basis of the voltage of the remote-sensing terminal (see, for example, Japanese Patent Laid-Open No. 11-327663 and Japanese Patent Laid-Open No. 2002-262553). In such a power supply device, the voltage of a specific circuit section of the loading apparatus can be fed back to the power supply device by connecting the specific circuit section of the loading apparatus to the remote-sensing terminal using a cable or the like. That is, the power supply device having remote-sensing functions can control the output voltage on the basis of the voltage of the specific circuit section of the loading apparatus fed back through the remote-sensing terminal. It is therefore possible to maintain the voltage of the specific circuit section of the loading apparatus at a predetermined voltage with high accuracy.

In reality, however, the remote-sensing functions are often not used even if the power supply device has the remote-sensing functions for the reason that, for example, a voltage drop arising in the power cable hardly matters in terms of the specifications of the loading apparatus. In this case, a circuit incorporated in the power supply device for the remote-sensing functions is not used at all and thus runs to waste.

An object of the present invention, which has been accomplished in view of such circumstances as described above, is to provide a power supply device which allows a circuit incorporated therein for remote-sensing functions to be also used for other applications.

SUMMARY OF THE INVENTION

The present invention is a power supply device provided with a constant-voltage power supply circuit; a first remote-sensing terminal; a second remote-sensing terminal pulled up to a predetermined voltage through a pull-up resistor; and a control unit for controlling the constant-voltage power supply circuit, wherein the control unit controls the output voltage of the constant-voltage power supply circuit on the basis of a potential difference between the first remote-sensing terminal and the second remote-sensing terminal on the condition that the voltage of the second remote-sensing terminal is lower than a threshold voltage, and sets a predetermined control parameter on the basis of the voltage of the second remote-sensing terminal on the condition that the voltage of the second remote-sensing terminal is equal to or higher than the threshold voltage.

When the output voltage of the constant-voltage power supply circuit is controlled on the basis of the potential difference between the first remote-sensing terminal and the second remote-sensing terminal, the second remote-sensing terminal is short-circuited to the ground on the loading apparatus side. Accordingly, the voltage of the second remote-sensing terminal at this time is nearly equal to 0 V.

On the other hand, the second remote-sensing terminal is pulled up to a predetermined voltage through the pull-up resistor. Accordingly, if an external resistor is disposed between the ground terminal and the second remote-sensing terminal of the power supply device in a case where output voltage control using remote sensing is not performed, the voltage of the second remote-sensing terminal equals a voltage given by dividing the predetermined voltage (pull-up voltage) at a ratio between the resistance value of the pull-up resistor and the resistance value of the external resistor. The voltage of the second remote-sensing terminal at this time can be changed by varying the resistance value of the external resistor. In addition, if the second remote-sensing terminal is made open, the voltage of the second remote-sensing terminal equals the predetermined voltage (pull-up voltage).

The control unit determines that the second remote-sensing terminal is connected to the ground on the loading apparatus side, on the condition that the voltage of the second remote-sensing terminal is lower than the threshold voltage. In this case, the control unit controls the output voltage of the constant-voltage power supply circuit on the basis of the potential difference between the first remote-sensing terminal and the second remote-sensing terminal. On the other hand, the control unit determines that an external resistor is disposed between the ground terminal of the power supply device and the second remote-sensing terminal or the second remote-sensing terminal is made open, on the condition that the voltage of the second remote-sensing terminal is equal to or higher than the threshold voltage. In this case, the control unit sets predetermined control parameters on the basis of the voltage of the second remote-sensing terminal at that time.

That is, the power supply device according to the present invention has remote-sensing functions and allows the second remote-sensing terminal to be used as a terminal for setting predetermined control parameters if the remote-sensing functions are not used. In addition, the predetermined control parameters can be set to optional values by adjusting the resistance value of the external resistor.

Consequently, according to the present invention, there is obtained the working effect of being able to provide a power supply device which allows a circuit incorporated therein for remote-sensing functions to be also used for other applications.

BRIEF DESCRIPTION OF THE DRAWINGS

The present invention will become more fully understood from the detailed description given hereinafter and the accompanying drawings which are given by way of illustration only, and thus, are not limitative of the present invention, and wherein:

FIG. 4 is a table showing the relationship between the resistance value of an external resistor and the current limit value of a constant-voltage power supply circuit;

DETAILED DESCRIPTION OF THE INVENTION

Figure 1:
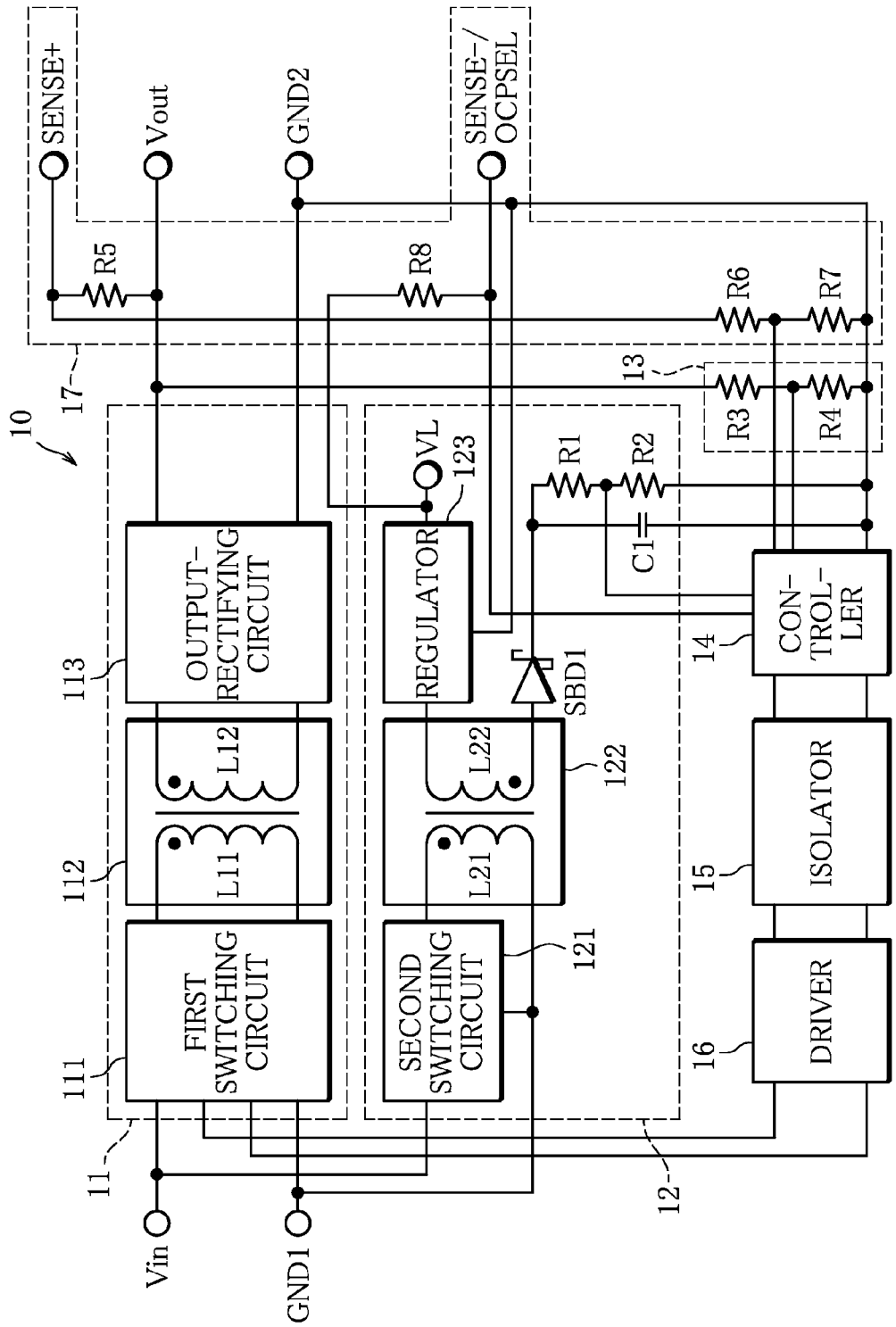
FIG. 1 is a block diagram illustrating the configuration of a DC/DC converter according to the present invention.

The configuration of a DC/DC converter 10 as one example of a "power supply device" according to the present invention will be described while referring to FIG. 1. FIG. 1 is a block diagram illustrating the configuration of the DC/DC converter 10 according to the present invention.

The DC/DC converter 10 is an insulated DC/DC converter and is provided with a constant-voltage power supply circuit 11, an input voltage detecting circuit 12, an output voltage detecting circuit 13, a controller 14, an isolator 15, a driver 16, and a remote-sensing circuit 17.

The constant-voltage power supply circuit 11 includes a first switching circuit 111, a first transformer 112, and an output-rectifying circuit 113.

The first switching circuit 111, to the input side of which an input voltage Vin and a primary-side ground GND1 are connected, is used to switch the input voltage Vin. More specifically, the first switching circuit 111 is used to switch (turn on and off) the input voltage Vin using switching elements, such as transistors or MOSFETs (Metal-oxide-semiconductor Field Effect Transistors), to convert the input voltage Vin which is a DC voltage to an AC voltage and supply the AC voltage to a primary winding L11 of the first transformer 112. Switching in the first switching circuit 111 is controlled by the controller 14.

The first transformer 112 includes the primary winding L11 and a secondary winding L12 and transfers the AC voltage supplied to the primary winding L11 by the switching operation of the first switching circuit 111 to the secondary winding L12. More specifically, the first transformer 112 transforms an AC voltage arising in the primary winding L11 at a ratio according to the turn ratio (N1/N2) between the number of turns N1 of the primary winding L11 and the number of turns N2 of the secondary winding L12, and transfers the AC voltage to the secondary winding L12.

The output-rectifying circuit 113 is used to rectify and output electrical power transferred to the secondary winding L12. More specifically, the output-rectifying circuit 113 is configured by combining rectifying devices, such as diodes, and elements, such as coils and capacitors and rectifies and smoothes an AC voltage output from the secondary winding L22 to convert the AC voltage to a DC voltage. The DC voltage output from the output-rectifying circuit 113 serves as an output voltage Vout.

The input voltage detecting circuit 12 is used to detect the input voltage Vin and includes a second switching circuit 121, a second transformer 122, a regulator 123, a Schottky barrier diode SBD1, resistors R1 and R2, and a capacitor C1.

The second switching circuit 121 is used to switch the input voltage Vin at predetermined time intervals. More specifically, the second switching circuit 121 is used to convert the input voltage Vin which is a DC voltage to an AC voltage having a predetermined frequency, and supply the AC voltage to a primary winding L21 of the second transformer 122. The second transformer 122 includes the primary winding L21 and a secondary winding L22 and transfers the AC voltage supplied to the primary winding L21 by the switching operation of the second switching circuit 121 to the secondary winding L22. The regulator 123 is, for example, a three-terminal regulator which is a constant-voltage circuit used to maintain the voltage of one end side of the secondary winding L22 of the second transformer 122 at a voltage VL (+3.3 V).

The Schottky barrier diode SBD1 and the capacitor C1 constitute a rectifying circuit. The rectifying circuit rectifies the AC voltage output to the secondary winding L22 of the second transformer 122 and converts the AC voltage to a DC voltage. More specifically, the anode of the Schottky barrier diode SBD1 is connected to the other end side of the secondary winding L22 of the second transformer 122, and the cathode of the diode is connected to one end side of the capacitor C1. The other end side of the capacitor C1 is connected to the secondary-side ground GND2. The two resistors R1 and R2 constitute a voltage-dividing circuit. More specifically, one end side of the resistor R1 is connected to the cathode of the Schottky barrier diode SBD1 and the other end side of the resistor is connected to one end side of the resistor R2. The other end side of the resistor R2 is connected to the secondary-side ground GND2. In addition, a connection point between the resistor R1 and the resistor R2 is connected to the controller 14.

The output voltage detecting circuit 13 is a voltage-dividing circuit constituted of two resistors R3 and R4 and is used to detect the output voltage Vout. More specifically, one end side of the resistor R3 is connected to the output voltage Vout, and the other end side of the resistor is connected to one end side of the resistor R4. The other end side of the resistor R4 is connected to the secondary-side ground GND2. In addition, a connection point between the resistor R3 and the resistor R4 is connected to the controller 14.

The controller 14 serving as the "control unit" is a heretofore-known microcomputer-controlled device and controls the constant-voltage power supply circuit 11 on the basis of the input voltage Vin detected by the input voltage detecting circuit 12 and the output voltage Vout detected by the output voltage detecting circuit 13. More specifically, the controller 14 performs constant-voltage control in which adjustments are made to increase or decrease the duty ratio of switching in the first switching circuit 111 according to the variation of the input voltage Vin, so that a constant value of the output voltage Vout is maintained even if the input voltage Vin fluctuates. The isolator 15 isolates the controller 14 disposed on the secondary side and the driver 16 disposed on the primary side from each other in a direct-current manner. The driver 16 is a circuit used to drive the switching elements of the first switching circuit 111 on the basis of a control signal output from the controller 14.

The remote-sensing circuit 17 includes a SENSE+ terminal, a SENSE−/OCPSEL terminal, and four resistors R5 to R8.

The SENSE+ terminal serving as the "first remote-sensing terminal" is connected to one end side of the resistor R6. The other end side of the resistor R6 is connected to one end side of the resistor R7. The other end side of the resistor R7 is connected to the secondary-side ground GND2. In addition, a connection point between the resistor R6 and the resistor R7 is connected to the controller 14. Yet additionally, the SENSE+ terminal is connected to the output voltage Vout through the resistor R5. The controller 14 can evaluate the voltage of the SENSE+ terminal on the basis of the voltage of the connection point between the resistor R6 and the resistor R7.

The SENSE−/OCPSEL terminal serving as the "second remote-sensing terminal" is connected to the controller 14. In addition, the SENSE−/OCPSEL terminal is pulled up to the voltage VL (+3.3 V) through the pull-up resistor R8. The pull-up resistor R8 can be set to an optional resistance value. In the present embodiment, the resistance value of the pull-up resistor R8 is 47 kΩ.

The operation of the DC/DC converter 10 will be described while referring to FIGS. 2 to 4 and 5A and 5B.

Figure 2:
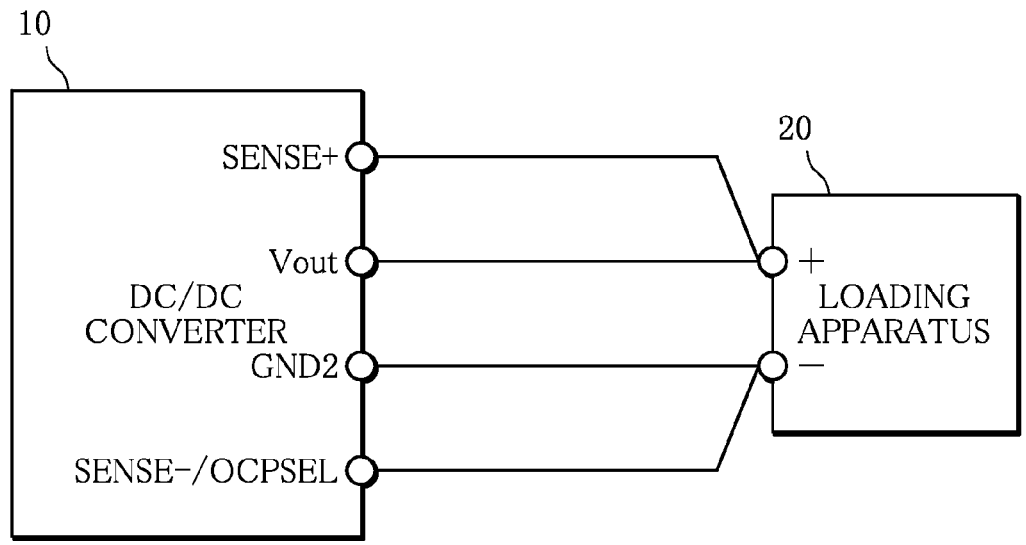
FIG. 2 is a block diagram of a system configuration in which output voltage control using remote sensing is performed.

FIG. 2 is a block diagram illustrating a system configuration in which output voltage control using remote sensing is performed.

When output voltage control using remote sensing is performed, the Vout terminal (a terminal to which the output voltage Vout of the constant-voltage power supply circuit 11 is output) of the DC/DC converter 10 is connected to the + terminal of the voltage input section of the loading apparatus 20 through a cable or the like. The GND2 terminal (a terminal to which the secondary-side ground GND2 is connected) of the DC/DC converter 10 is connected to the − terminal of the voltage input section of the loading apparatus 20 through a cable or the like. The SENSE+ terminal of the DC/DC converter 10 is connected to the + terminal of the voltage input section of the loading apparatus 20 through a cable or the like. The SENSE−/OCPSEL terminal of the DC/DC converter 10 is connected to the − terminal of the voltage input section of the loading apparatus 20 through a cable or the like. That is, the SENSE−/OCPSEL terminal is short-circuited to the secondary-side ground GND2 at the − terminal of the voltage input section of the loading apparatus 20. Accordingly, the voltage of the SENSE−/OCPSEL terminal is nearly equal to 0 V.

In such a system configuration as described above, the controller 14 of the DC/DC converter 10 determines that the SENSE−/OCPSEL terminal is short-circuited to the ground on the loading apparatus 20 side, on the condition that the voltage of the SENSE−/OCPSEL terminal is lower than a threshold voltage, and performs output voltage control using remote sensing. More specifically, the controller 14 of the DC/DC converter 10 controls the output voltage Vout of the constant-voltage power supply circuit 11 on the basis of a potential difference between the SENSE+ terminal and the SENSE−/OCPSEL terminal, so that the voltage of the voltage input section of the loading apparatus 20 equals a rated voltage.

Figure 3:
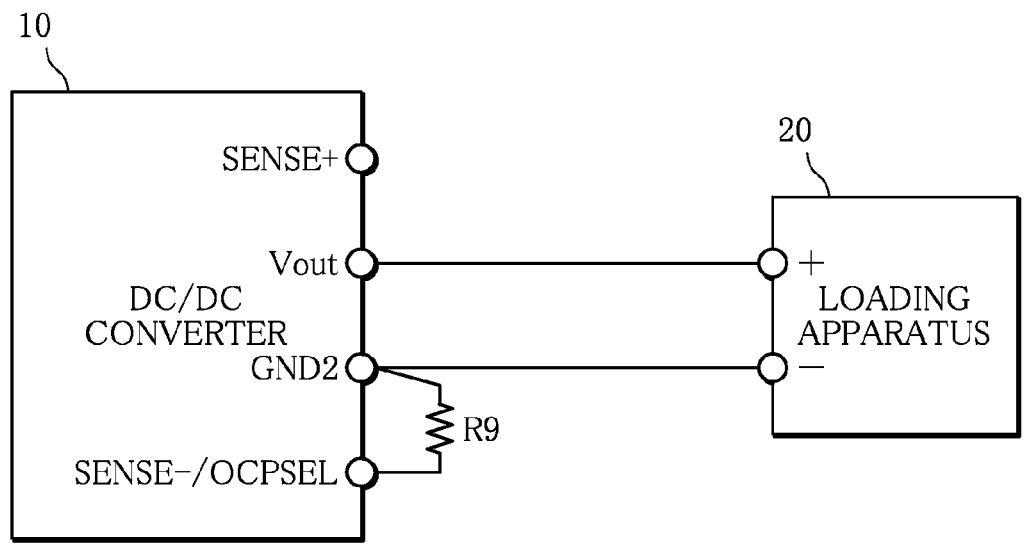
FIG. 3 is a block diagram of a system configuration in which output voltage control using remote sensing is not performed.

FIG. 3 is a block diagram illustrating a system configuration in which output voltage control using remote sensing is not performed.

If output voltage control using remote sensing is not performed, the Vout terminal of the DC/DC converter 10 is connected to the + terminal of the voltage input section of the loading apparatus 20 through a cable or the like. The GND2 terminal of the DC/DC converter 10 is connected to the − terminal of the voltage input section of the loading apparatus 20 through a cable or the like. Nothing is connected to the SENSE+ terminal of the DC/DC converter 10. The SENSE−/OCPSEL terminal of the DC/DC converter 10 is either fitted with an external resistor R9 disposed between the SENSE−/OCPSEL terminal and the GND2 terminal, or not fitted with anything and made open.

As described above, the SENSE−/OCPSEL terminal of the DC/DC converter 10 is pulled up to the voltage VL through the resistor R8 (pull-up resistor). Accordingly, if the external resistor R9 is disposed between the GND2 terminal of the DC/DC converter 10 and the SENSE−/OCPSEL terminal, the voltage of the SENSE−/OCPSEL terminal equals a voltage given by dividing the voltage VL (pull-up voltage) at a ratio between the resistance value of the resistor R8 (pull-up resistor) and the resistance value of the external resistor R9. The voltage of the SENSE−/OCPSEL terminal at this time can be changed by varying the resistance value of the external resistor R9. If the SENSE−/OCPSEL terminal is made open, the voltage of the SENSE−/OCPSEL terminal equals the voltage VL (pull-up voltage).

In such a system configuration as described above, the controller 14 of the DC/DC converter 10 determines that the external resistor R9 is disposed between the GND2 terminal and the SENSE−/OCPSEL terminal of the DC/DC converter 10 or the SENSE−/OCPSEL terminal is made open, on the condition that the voltage of the SENSE−/OCPSEL terminal is equal to or higher than the threshold voltage. In this case, the controller 14 of the DC/DC converter 10 sets a current limit value (predetermined control parameter) of the output current of the constant-voltage power supply circuit 11 on the basis of the voltage of the SENSE−/OCPSEL terminal.

FIG. 4 is a table showing the relationship between the resistance value of the external resistor R9 and the current limit value of the output current of the constant-voltage power supply circuit 11.

SENSE−/OCPSEL A/D VALUE refers to the minimum, average and maximum values of the voltage of the SENSE−/OCPSEL terminal with respect to the resistance value of the external resistor R9. These voltage values are digital values given after the voltage values are A/D-converted by an A/D conversion circuit built in the controller 14. OCP refers to the ratio of the output current in current limit value to the rated current of the constant-voltage power supply circuit 11. For example, if OCP is 15%, the current limit value of the output current of the constant-voltage power supply circuit 11 is 15% of the rated current of the constant-voltage power supply circuit 11. A designated value FAULT is a control parameter used to disable the output of the constant-voltage power supply circuit 11 when the output current of the constant-voltage power supply circuit 11 increases to the current limit value. A designated value WARNING is a control parameter used to raise an alarm (alarm sound, alarm lamp, or the like) right before the output current of the constant-voltage power supply circuit 11 increases to the current limit value.

Figure 5A:
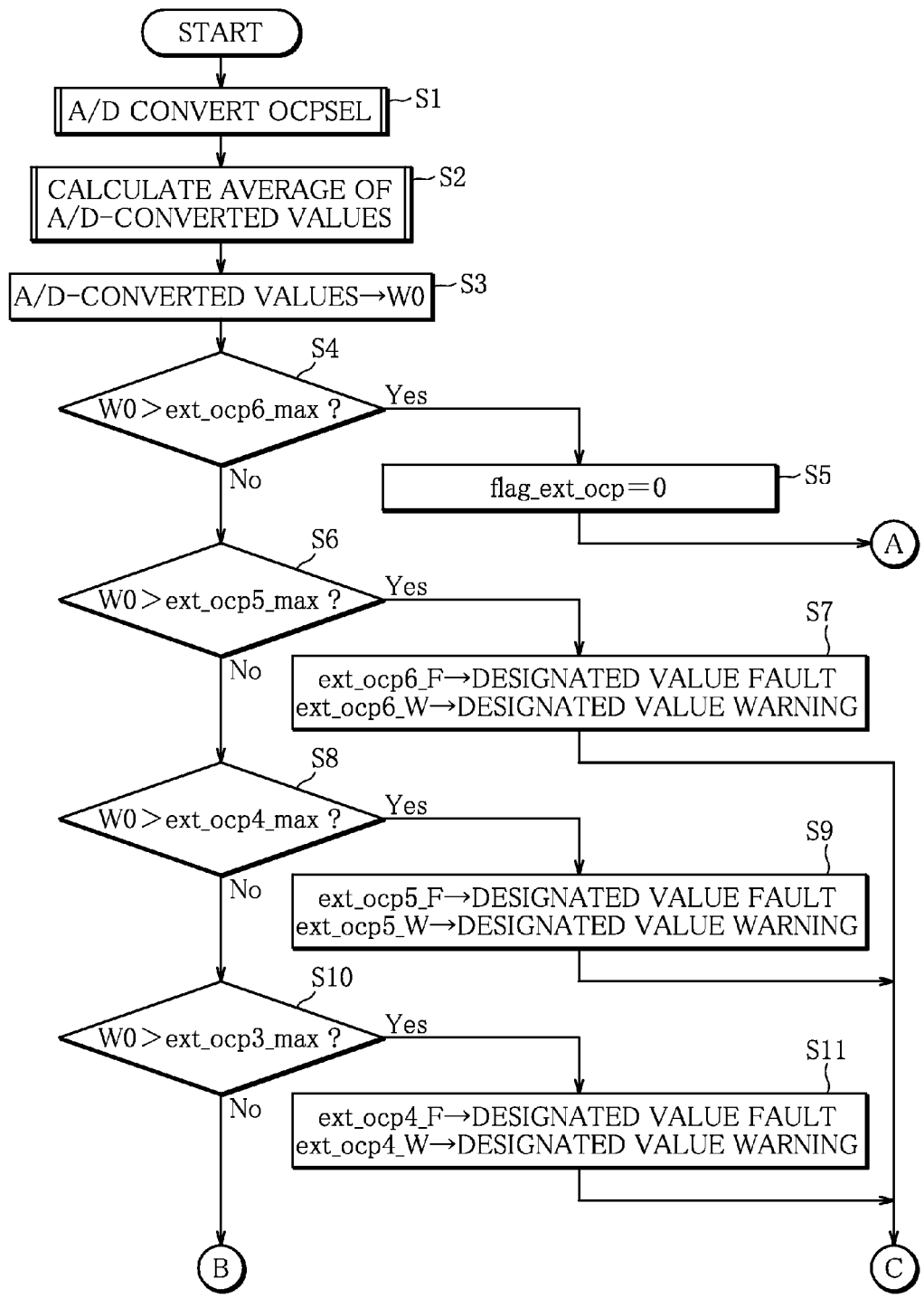
FIG. 5A is a flowchart illustrating a control procedure performed by a controller.
Figure 5B:
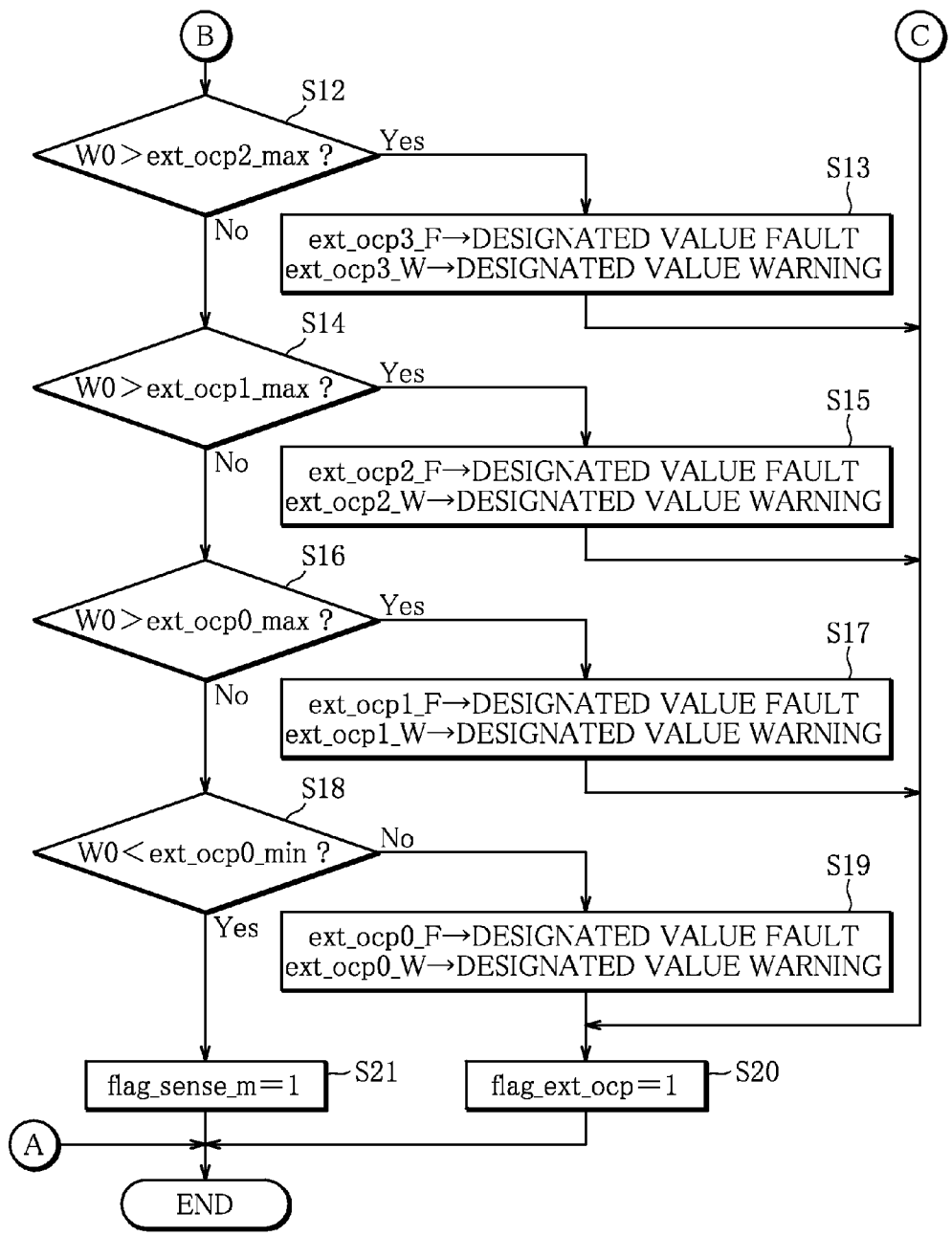
FIG. 5B is another flowchart illustrating a control procedure performed by the controller.

FIGS. 5A and 5B are flowcharts illustrating control procedures performed by the controller 14. Hereinafter, a description will be made of the control procedures using the flowcharts illustrated in FIG. 5A, FIG. 5B.

First, the voltage of the SENSE−/OCPSEL terminal is A/D-converted (step S1). Then, A/D-converted values are obtained a plurality of times to calculate an average of the values (step S2), and the average of the A/D-converted values is set in a register W0 (step S3).

Subsequently, a determination is made whether or not the value of the register W0 is larger than a preset value ext_ocp6_max (step S4). If the value of the register W0 is larger than the preset value ext_ocp6_max (Yes in step S4), a determination is made that an external resistor R9 larger in resistance value than 130 kΩ is disposed between the GND2 terminal and the SENSE−/OCPSEL terminal or the SENSE−/OCPSEL terminal is made open. In this case, the value of flag_ext_ocp which is a flag used to determine whether or not the output current is limited is set to 0 (step S5). Consequently, the DC/DC converter 10 is configured such that the output current of the constant-voltage power supply circuit 11 is not limited (default setting).

If the value of the register W0 is equal to or smaller than the preset value ext_ocp6_max (No in step S4), then a determination is made whether or not the value of the register W0 is larger than a preset value ext_ocp5_max (step S6). If the value of the register W0 is larger than the preset value ext_ocp5_max (Yes in step S6), a determination is made that an external resistor R9 having a resistance value of 130 kΩ is disposed between the GND2 terminal and the SENSE−/OCPSEL terminal. In this case, the designated value FAULT is set to ext_ocp6_F and the designated value WARNING is set to ext_ocp6_W, so that OCP equals 100% (step S7). In addition, the value of flag_ext_ocp is set to 1 (step S20). Consequently, the DC/DC converter 10 is configured such that the output current of the constant-voltage power supply circuit 11 is limited on the basis of the designated values FAULT and WARNING thus set.

If the value of the register W0 is equal to or smaller than the preset value ext_ocp5_max (No in step S6), then a determination is made whether or not the value of the register W0 is larger than the preset value ext_ocp4_max (step S8). If the value of the register W0 is larger than the preset value ext_ocp4_max (Yes in step S8), a determination is made that an external resistor R9 having a resistance value of 82 kΩ is disposed between the GND2 terminal and the SENSE−/OCPSEL terminal. In this case, the designated value FAULT is set to ext_ocp5_F and the designated value WARNING is set to ext_ocp5_W, so that OCP equals 90% (step S9). In addition, the value of flag_ext_ocp is set to 1 (step S20). Consequently, the DC/DC converter 10 is configured such that the output current of the constant-voltage power supply circuit 11 is limited on the basis of the designated values FAULT and WARNING thus set.

If the value of the register W0 is equal to or smaller than the preset value ext_ocp4_max (No in step S8), then a determination is made whether or not the value of the register W0 is larger than a preset value ext_ocp3_max (step S10). If the value of the register W0 is larger than the preset value ext_ocp3_max (Yes in step S10), a determination is made that an external resistor R9 having a resistance value of 56 kΩ is disposed between the GND2 terminal and the SENSE−/OCPSEL terminal. In this case, the designated value FAULT is set to ext_ocp4_F and the designated value WARNING is set to ext_ocp4_W, so that OCP equals 75% (step S11). In addition, the value of flag_ext_ocp is set to 1 (step S20). Consequently, the DC/DC converter 10 is configured such that the output current of the constant-voltage power supply circuit 11 is limited on the basis of the designated values FAULT and WARNING thus set.

If the value of the register W0 is equal to or smaller than the preset value ext_ocp3_max (No in step S10), then a determination is made whether or not the value of the register W0 is larger than a preset value ext_ocp2_max (step S12). If the value of the register W0 is larger than the preset value ext_ocp2_max (Yes in step S12), a determination is made that an external resistor R9 having a resistance value of 36 kΩ is disposed between the GND2 terminal and the SENSE−/OCPSEL terminal. In this case, the designated value FAULT is set to ext_ocp3_F and the designated value WARNING is set to ext_ocp3_W, so that OCP equals 60% (step S13). In addition, the value of flag_ext_ocp is set to 1 (step S20). Consequently, the DC/DC converter 10 is configured such that the output current of the constant-voltage power supply circuit 11 is limited on the basis of the designated values FAULT and WARNING thus set.

If the value of the register W0 is equal to or smaller than the preset value ext_ocp2_max (No in step S12), then a determination is made whether or not the value of the register W0 is larger than a preset value ext_ocp1_max (step S14). If the value of the register W0 is larger than the preset value ext_ocp1_max (Yes in step S14), a determination is made that an external resistor R9 having a resistance value of 24 kΩ is disposed between the GND2 terminal and the SENSE−/OCPSEL terminal. In this case, the designated value FAULT is set to ext_ocp2_F and the designated value WARNING is set to ext_ocp2_W, so that OCP equals 45% (step S15). In addition, the value of flag_ext_ocp is set to 1 (step S20). Consequently, the DC/DC converter 10 is configured such that the output current of the constant-voltage power supply circuit 11 is limited on the basis of the designated values FAULT and WARNING thus set.

If the value of the register W0 is equal to or smaller than the preset value ext_ocp1_max (No in step S14), then a determination is made whether or not the value of the register W0 is larger than a preset value ext_ocp0_max (step S16). If the value of the register W0 is larger than the preset value ext_ocp0_max (Yes in step S16), a determination is made that an external resistor R9 having a resistance value of 15 kΩ is disposed between the GND2 terminal and the SENSE−/OCPSEL terminal. In this case, the designated value FAULT is set to ext_ocp1_F and the designated value WARNING is set to ext_ocp1_W, so that OCP equals 30% (step S17). In addition, the value of flag_ext_ocp is set to 1 (step S20). Consequently, the DC/DC converter 10 is configured such that the output current of the constant-voltage power supply circuit 11 is limited on the basis of the designated values FAULT and WARNING thus set.

If the value of the register W0 is equal to or smaller than the preset value ext_ocp0_max (No in step S16), then a determination is made whether or not the value of the register W0 is smaller than a preset value ext_ocp0_min defined as the "threshold voltage" (step S18). If the value of the register W0 is equal to or larger than the preset value ext_ocp0_min (No in step S18), a determination is made that an external resistor R9 having a resistance value of 10 kΩ is disposed between the GND2 terminal and the SENSE−/OCPSEL terminal. In this case, the designated value FAULT is set to ext_ocp0_F and the designated value WARNING is set to ext_ocp0_W, so that OCP equals 15% (step S19). In addition, the value of flag_ext_ocp is set to 1 (step S20). Consequently, the DC/DC converter 10 is configured such that the output current of the constant-voltage power supply circuit 11 is limited on the basis of the designated values FAULT and WARNING thus set.

If the value of the register W0 is smaller than the preset value ext_ocp0_min defined as the "threshold voltage" (Yes in step S18), a determination is made that the SENSE−/OCPSEL terminal is short-circuited to the ground on the loading apparatus 20 side. In this case, the value of flag_sense_m is set to 1 (step S21). Consequently, the DC/DC converter 10 is configured such that the output voltage Vout of the constant-voltage power supply circuit 11 is controlled on the basis of a potential difference between the SENSE+ terminal and the SENSE−/OCPSEL terminal, so that the voltage of the voltage input section of the loading apparatus 20 equals a rated voltage.

As has been described heretofore, the DC/DC converter 10 according to the present invention has remote-sensing functions and allows the SENSE−/OCPSEL terminal to be used as a terminal for setting predetermined control parameters if the remote-sensing functions are not used. In addition, the predetermined control parameters can be set to optional values by adjusting the resistance value of the external resistor R9.

As described above, according to the present invention, it is possible to provide a power supply device which allows a circuit incorporated therein for remote-sensing functions to be also used for other applications. In addition, although a DC/DC converter has been cited and described as one example of the power supply device, the present invention can also be carried out in, for example, AC/DC converters. It is needless to say that the working effect of the present invention can also be obtained in such power supply devices. Yet additionally, predetermined control parameters in the present invention are not limited in particular to the current limit value of the output current of the above-described constant-voltage power supply circuit 11 but may be any control parameters, as long as the control parameters are used for the control of the constant-voltage power supply circuit 11.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A power supply device comprising:
   a constant-voltage power supply circuit;
   a first remote-sensing terminal;
   a second remote-sensing terminal pulled up to a predetermined voltage through a pull-up resistor; and
   a control unit for controlling the constant-voltage power supply circuit,
   wherein the control unit controls the output voltage of the constant-voltage power supply circuit on the basis of a potential difference between the first remote-sensing terminal and the second remote-sensing terminal on the condition that the voltage of the second remote-sensing terminal is lower than a threshold voltage, and sets a predetermined control parameter on the basis of the voltage of the second remote-sensing terminal on the condition that the voltage of the second remote-sensing terminal is equal to or higher than the threshold voltage.

2. The power supply device according to claim 1, wherein the predetermined control parameter is a current limit value of the output current of the constant-voltage power supply circuit.

* * * * *